United States Patent
Lin et al.

(10) Patent No.: US 9,384,825 B2
(45) Date of Patent: Jul. 5, 2016

(54) MULTI-PORT MEMORY CIRCUITS

(71) Applicant: QUALCOMM Incorporated, San Diego, CA (US)

(72) Inventors: Jentsung Lin, Carlsbad, CA (US); Paul Bassett, Austin, TX (US); Suresh Venkumahanti, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/499,041

(22) Filed: Sep. 26, 2014

(65) Prior Publication Data

US 2016/0093363 A1 Mar. 31, 2016

(51) Int. Cl.
| | |
|---|---|
| *G11C 11/00* | (2006.01) |
| *G11C 11/419* | (2006.01) |
| *G11C 11/412* | (2006.01) |
| *G11C 8/08* | (2006.01) |

(52) U.S. Cl.
CPC ............ *G11C 11/419* (2013.01); *G11C 11/412* (2013.01); *G11C 8/08* (2013.01)

(58) Field of Classification Search
CPC ...... G11C 8/08; G11C 11/413; G11C 11/412; G11C 11/419; G11C 7/22; G11C 8/10; G11C 7/1045
USPC ........... 365/154, 156, 189.15–189.16, 230.06
See application file for complete search history.

(56) References Cited

U.S. PATENT DOCUMENTS

| | | | |
|---|---|---|---|
| 5,644,547 A | 7/1997 | Grishakov et al. | |
| 6,078,544 A | 6/2000 | Park | |
| 6,556,501 B1 | 4/2003 | Naffziger | |
| 6,859,385 B2 | 2/2005 | Karlsson et al. | |
| 7,894,296 B2 | 2/2011 | Lee et al. | |
| 8,391,086 B2 * | 3/2013 | Martinozzi | G11C 16/10 365/120 |
| 8,879,334 B2 * | 11/2014 | Ishii | G11C 7/22 365/154 |
| 9,058,861 B2 * | 6/2015 | Behrends | G11C 7/12 |
| 9,070,477 B1 * | 6/2015 | Clark | G11C 11/419 |
| 2008/0123462 A1 | 5/2008 | Liaw | |
| 2013/0188434 A1 | 7/2013 | Puckett et al. | |
| 2014/0050033 A1 | 2/2014 | Otto et al. | |
| 2014/0219039 A1 | 8/2014 | Jung et al. | |

OTHER PUBLICATIONS

International Search Report and Written Opinion—PCT/US2015/049561—ISA/EPO—Nov. 23, 2015.

* cited by examiner

*Primary Examiner* — David Lam
(74) *Attorney, Agent, or Firm* — Muncy, Geissler, Olds & Lowe, P.C.

(57) ABSTRACT

A multi-port hybrid full-swing/low-swing memory circuit in a static random access memory (SRAM) device comprises a first wordline driver that comprises a read wordline driver, a second wordline driver that comprises either a read wordline driver or a read/write wordline driver, a memory cell coupled to the first and second wordline drivers, a sense amplifier coupled to the memory cell, and a latch coupled to the memory cell. The memory circuit is capable of achieving high-speed low-swing or low-speed full-swing operations while avoiding the need for a large circuit area on an integrated circuit.

20 Claims, 3 Drawing Sheets

MULTI-PORT MEMORY CIRCUITS

FIELD OF DISCLOSURE

Various embodiments described herein relate to memory circuits, and more particularly, to multi-port memory circuits.

BACKGROUND

Various circuit layouts have been devised for random access memories (RAM) including static random access memories (SRAM). Moreover, various attempts have been made to design memory circuits that support higher memory bandwidths, that is, higher memory throughput or speed, while attempting to avoid the necessity of increasing the surface area of the circuit layout, also called an area penalty. One type of conventional scheme to increase the memory bandwidth, for example, is called double pumping, that is, to run the memory array at twice the frequency of the core frequency, that is, the clock rate of the processor with which the memory array operates. Even with double pumping, however, the speed of memory access typically limits the maximum core frequency. Another type of conventional scheme to increase the memory bandwidth is to partition a memory into multiple small banks by memory address. If there is no address conflict, multiple banks of memory may be accessed at the same time. A partitioned memory with a structure of multiple small banks, however, may incur an area penalty because such a memory may require a larger surface area than a non-partitioned memory of the same transistor size and the same capacity.

Moreover, various conventional circuits have been designed for SRAM cells with tradeoffs between memory speed, circuit area and the number of read/write ports for memory access. For example, a conventional low-swing 6T memory cell (the number before "T" designates the number of transistors per cell) with a single wordline driver may occupy a relatively small circuit area, but may be only capable of supporting either one read or one write at a given time, and the speed of memory access may be relatively slow. As another example, a conventional full-swing 8T memory cell with separate read and write wordline drivers may be capable of supporting one read and one write at a time for different entries and operating at a relatively fast memory speed. However, such a conventional full-swing 8T memory cell may require an increased circuit area compared to low-speed memory circuits.

Another example of a conventional 8T memory cell design is a low-swing 8T memory cell with shared read/write bitlines that may be capable of supporting two reads, or one write and one read, or two writes at a time for different entries. Although such a conventional low-swing 8T memory cell may be capable of supporting multiple simultaneous reads/writes, it may have a relatively slow memory speed while incurring a relatively large circuit area penalty. Yet another example of a conventional memory cell design is a full-swing 10T memory cell having separate read/write bitlines that may be capable of supporting as many as two reads and one write at a time for different entries and operating at a relatively fast memory speed. However, such a conventional full-swing 10T memory cell typically occupies a significantly larger circuit area than conventional 6T or 8T memory cells. It is typically difficult to satisfy the competing demands of fast memory speed, small circuit size and simultaneous multiple read/write operations in a single memory circuit design.

SUMMARY

Exemplary embodiments of the disclosure are directed to a memory device that is capable of supporting a large memory bandwidth for high-speed memory access and multiple simultaneous read/write operations without incurring a significant circuit area penalty.

In an embodiment, a memory circuit comprises: a first wordline driver comprising a read wordline driver; a second wordline driver comprising a driver selected from the group consisting of a read wordline driver and a read/write wordline driver; a memory cell coupled to the first and second wordline drivers; a sense amplifier coupled to the memory cell; and a latch coupled to the memory cell.

In another embodiment, a device comprises: a static random access memory (SRAM), comprising: a first wordline driver comprising a read wordline driver; a second wordline driver comprising a driver selected from the group consisting of a read wordline driver and a read/write wordline driver; an SRAM cell coupled to the first and second wordline drivers; a sense amplifier coupled to the memory cell; and a latch coupled to the memory cell.

In another embodiment, a memory device comprises: means for driving a bitline and a complement of the bitline; means for driving a first wordline; means for driving a second wordline; a memory cell coupled to the means for driving the bitline, the means for driving the first wordline, and means for driving the second wordline; means for sense-amplifying signals from the bitline and the complement of the bitline; and means for latching a readout from the memory cell.

In yet another embodiment, a method of operating a memory cell comprises: driving a bitline and a complement of the bitline coupled to the memory cell; driving a first wordline coupled to the memory cell; driving a second wordline coupled to the memory cell; sense-amplifying signals from the bitline and the complement of the bitline; and latching a readout from the memory cell.

BRIEF DESCRIPTION OF THE DRAWINGS

The accompanying drawings are presented to aid in the description of embodiments and are provided solely for illustration of the embodiments and not limitations thereof.

DETAILED DESCRIPTION

Aspects of the disclosure are disclosed in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise.

It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
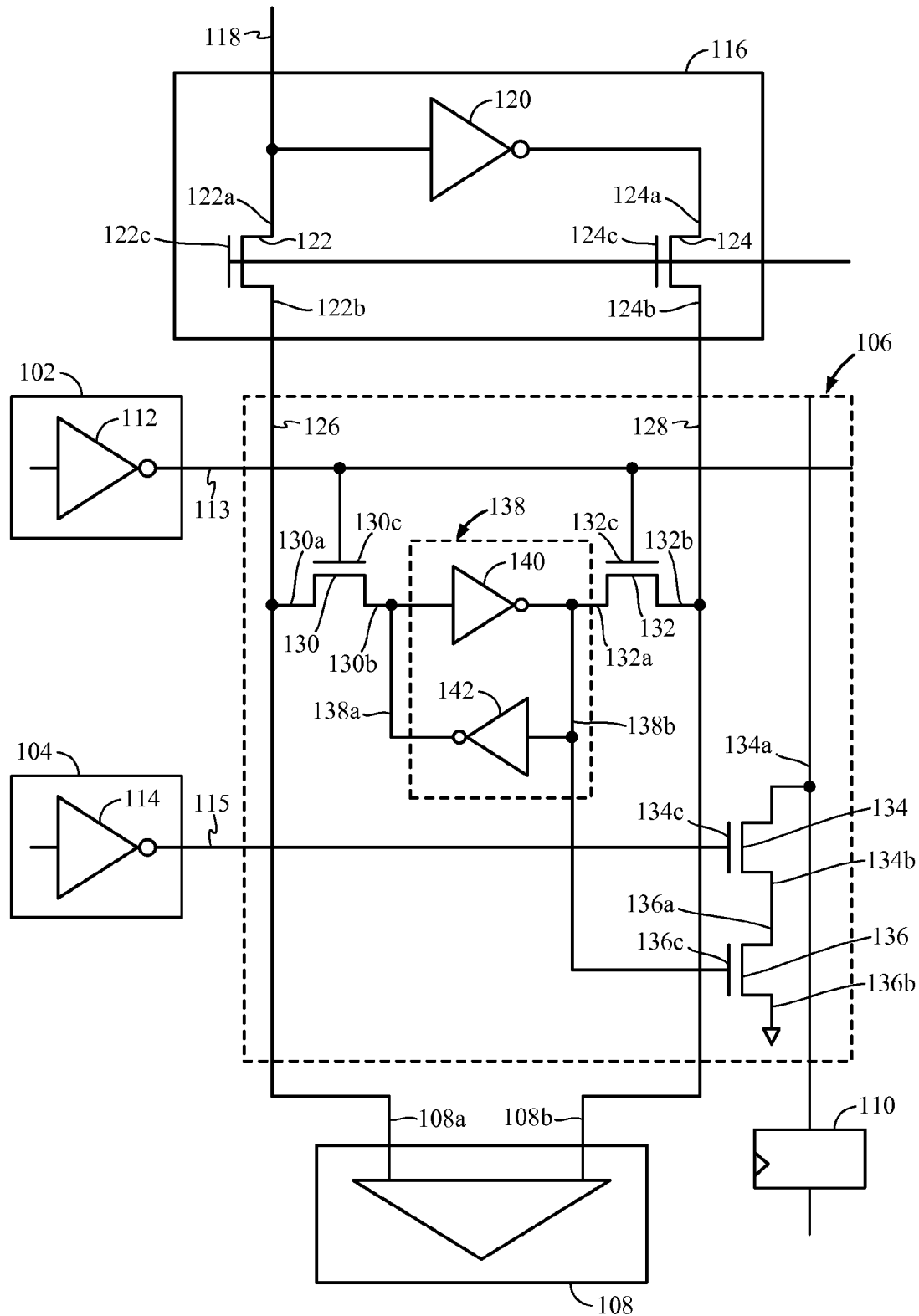
FIG. 1 is a circuit diagram of a multi-port memory according to an embodiment.

FIG. 1 is a circuit diagram illustrating an embodiment of a multi-port memory circuit. Such a memory circuit may be implemented in a static random access memory (SRAM) device, for example. In the embodiment shown in FIG. 1, the memory circuit includes a first wordline driver 102, a second wordline driver 104, a memory cell 106 coupled to the first and second wordline drivers 102 and 104, a sense amplifier 108 coupled to the memory cell 106, and a latch 110 coupled to the memory cell 106. In an embodiment, the first wordline driver 102 comprises a read wordline driver, whereas the second wordline driver 104 may be either a read wordline driver or a read/write wordline driver. In a further embodiment, the first and second wordline drivers 102 and 104 include first and second inverters 112 and 114, respectively. In an embodiment, the first and second wordline drivers 102 and 104 are implemented for driving first and second wordlines 113 and 115, respectively.

In an embodiment, the memory circuit further comprises a data input driver 116 coupled to the memory cell 106. In a further embodiment, the data input driver 116 comprises a write data input driver. In the embodiment shown in FIG. 1, the data input driver 116 includes a data input 118, an inverter 120 coupled to the data input 118, and two metal oxide semiconductor (MOS) transistors 122 and 124 coupled to the data input 118 and to the inverter 120.

In an embodiment, the first MOS transistor 122 comprises an N-channel MOS transistor having a drain 122a coupled to the data input 118, a source 122b coupled to the memory cell 106, and a gate 122c. In a further embodiment, the second MOS transistor 124 also comprises an N-channel MOS transistor having a drain 124a coupled to the output of the inverter 120, a source 124b coupled to the memory cell 106, and a gate 124c coupled to the gate 122c of the first MOS transistor 122. In an embodiment, the drain 122b of the first MOS transistor 122 feeds to a bitline 126, whereas the drain 124b of the second MOS transistor 124 feeds to a complement 128 of the bitline 126, because the inverter 120 coupled between the source 122a of the first N-channel MOS transistor 122 and the source 124a of the second N-channel MOS transistor 124 inverts each input bit from the data input 118. In an embodiment, the data input driver 116 is implemented for driving the bitline 126 and the complement 128 of the bitline 126.

In an embodiment, the memory cell 106, which may be implemented as an SRAM cell, comprises a first MOS transistor 130, a second MOS transistor 132, a third MOS transistor 134, a fourth MOS transistor 136, and a flip-flop 138. In a further embodiment, the first, second, third and fourth MOS transistors 130, 132, 134 and 136 each comprise an N-channel MOS transistor. In an embodiment, the first N-channel MOS transistor 130 comprises a drain 130a coupled to the bitline 126, a source 130b coupled to the flip-flop 138, and a gate 130c coupled to the first wordline 113. In an embodiment, the second N-channel MOS transistor 132 comprises a drain 132a coupled to the flip-flop 138, a source 132b coupled to the complement 128 of the bitline 126, and a gate 132c coupled to the first wordline 113. Thus, both gates 130c and 132c of the first and second N-channel MOS transistors 130 and 132, respectively, are coupled to the first wordline driver 102 through the first wordline 113.

In an embodiment, the third N-channel MOS transistor 134 comprises a drain 134a, a source 134b, and a gate 134c coupled to the second wordline driver 104 through the second wordline 115. In an embodiment, the fourth N-channel MOS transistor 136 comprises a drain 136a coupled to the source 134b of the third N-channel MOS transistor 134, a source 136b, and a gate 136c coupled to the flip-flop 138.

In an embodiment, the sense amplifier 108 has inputs 108a and 108b coupled to the bitline 126 and the complement 128 of the bitline 126, respectively. In the embodiment shown in FIG. 1, the inputs 108a and 108b of the sense amplifier 108 are also coupled to the drain 130a of the first N-channel MOS transistor 130 and the source 132b of the second N-channel MOS transistor 132, respectively. In an embodiment, the sense amplifier 108 is implemented for sense-amplifying signals from the bitline 126 and the complement 128 of the bitline 126 in a low-swing sense-amplifying read operation at twice the bandwidth or twice the frequency of a single read operation, thereby resulting in power savings by not requiring the bitline 126 and its complement 128 to swing to the full drain voltage of the N-channel transistors. In this embodiment, the sense amplifier 108 is implemented to amplify low-swing voltages from the bitline 126 and its complement 128 to generate full-swing logic outputs.

In an embodiment, the latch 110 is implemented for latching a readout from the memory cell 106. In the embodiment shown in FIG. 1, the latch 110 is coupled to the drain 134a of the third N-channel MOS transistor 134 in the memory cell 106. If high-bandwidth or high-frequency memory operation is not required, the latch 110 may be used as a full-swing latch for full-swing read operations, instead of using the sense amplifier 108 for sense-amplifying low-swing readouts to generate full-swing logic outputs. Thus, the memory cell 106 as shown in FIG. 1 and described above is capable of supporting either two read operations or one read and one write operations with two wordline drivers 102 and 104, as well as high-speed memory access with either double-bandwidth sense-amplifying operations on low-swing readouts, or single-bandwidth latching operations on full-swing readouts.

In the embodiment shown in FIG. 1, the flip-flop 138 comprises a first inverter 140 and a second inverter 142 cross-coupled to each other. However, other types of flip-flops may also be implemented in the memory cell 106 with the scope of the disclosure. In FIG. 1, the flip-flop 138 has a first terminal 138a formed by connecting the input of the first inverter 140 and the output of the second inverter 142, and a second terminal 138b formed by connecting the output of the first inverter 140 and the input of the second inverter 142. In an embodiment, the first terminal 138a of the flip-flop 138 is coupled to the source 130b of the first N-channel MOS transistor 130, whereas the second terminal 138b of the flip-flop 138 is coupled to the drain 132a of the second N-channel MOS transistor 132.

Figure 2:
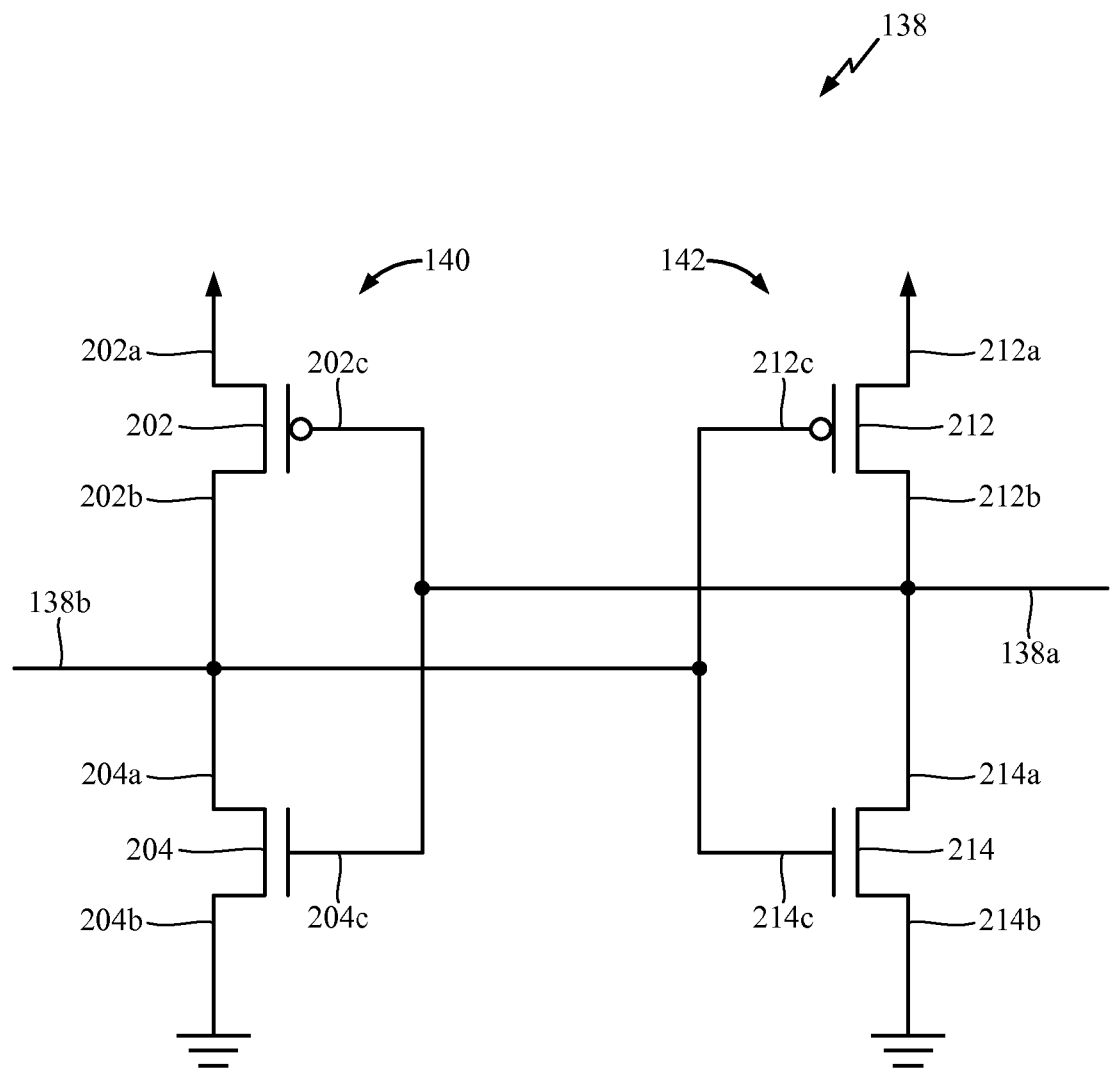
FIG. 2 is a circuit diagram of an embodiment of the flip-flop in the circuit diagram of FIG. 1.

FIG. 2 is a circuit diagram illustrating an embodiment of the cross-coupled inverter flip-flop 138 of FIG. 1. In the embodiment shown in FIG. 2, the first inverter 140 comprises a P-channel MOS transistor 202 and an N-channel MOS transistor 204 coupled to each other. In an embodiment, the P-channel MOS transistor 202 comprises a source 202a, a drain 202b and a gate 202c, while the N-channel MOS transistor 204 comprises a drain 204a, a source 204b and a gate 204c. In an embodiment, the drain 202b of the P-channel MOS transistor 202 and the drain 204a of the N-channel MOS transistor 204 are connected to each other, while the gate 202c of the P-channel MOS transistor 202 and the gate 204c of the N-channel MOS transistor 204 are also connected to each other.

In a similar manner, the second inverter 142 also comprises a P-channel MOS transistor 212 and an N-channel MOS transistor 214 coupled to each other. In an embodiment, the P-channel MOS transistor 212 comprises a source 212a, a drain 212b and a gate 212c, while the N-channel MOS transistor 214 comprises a drain 214a, a source 214b and a gate 214c. In an embodiment, the drain 212b of the P-channel MOS transistor 212 and the drain 214a of the N-channel MOS transistor 214 are connected to each other, while the gate 212c of the P-channel MOS transistor 212 and the gate 214c of the N-channel MOS transistor 214 are also connected to each other.

In the embodiment shown in FIG. 2, the connected drains 212b and 214a of the P-channel and N-channel MOS transistors 212 and 214 in the second inverter 142 are coupled to the connected gates 202c and 204c of the P-channel and N-channel MOS transistors 202 and 204 in the first inverter 140 to form the first terminal 138a. In a similar manner, the connected drains 202b and 204a of the P-channel and N-channel MOS transistors 202 and 204 in the first inverter 140 are coupled to the connected gates 212c and 214c of the P-channel and N-channel MOS transistors 212 and 214 in the second inverter 142 to form the second terminal 138b. In the embodiment shown in FIGS. 1 and 2, a total of eight transistors are implemented in the memory cell 106, including the four N-channel MOS transistors 130, 132, 134 and 136 as shown in FIG. 1, and the two P-channel MOS transistors 202 and 212 and the two N-channel MOS transistors 204 and 214 in the cross-coupled inverter flip-flop 138 as shown in FIG. 2. Thus, the memory cell 106 may be regarded as an 8T hybrid full-swing/low-swing memory cell in the embodiments shown in FIGS. 1 and 2 and described above. However, other circuit layouts may also be implemented within the scope of the disclosure.

Figure 3:
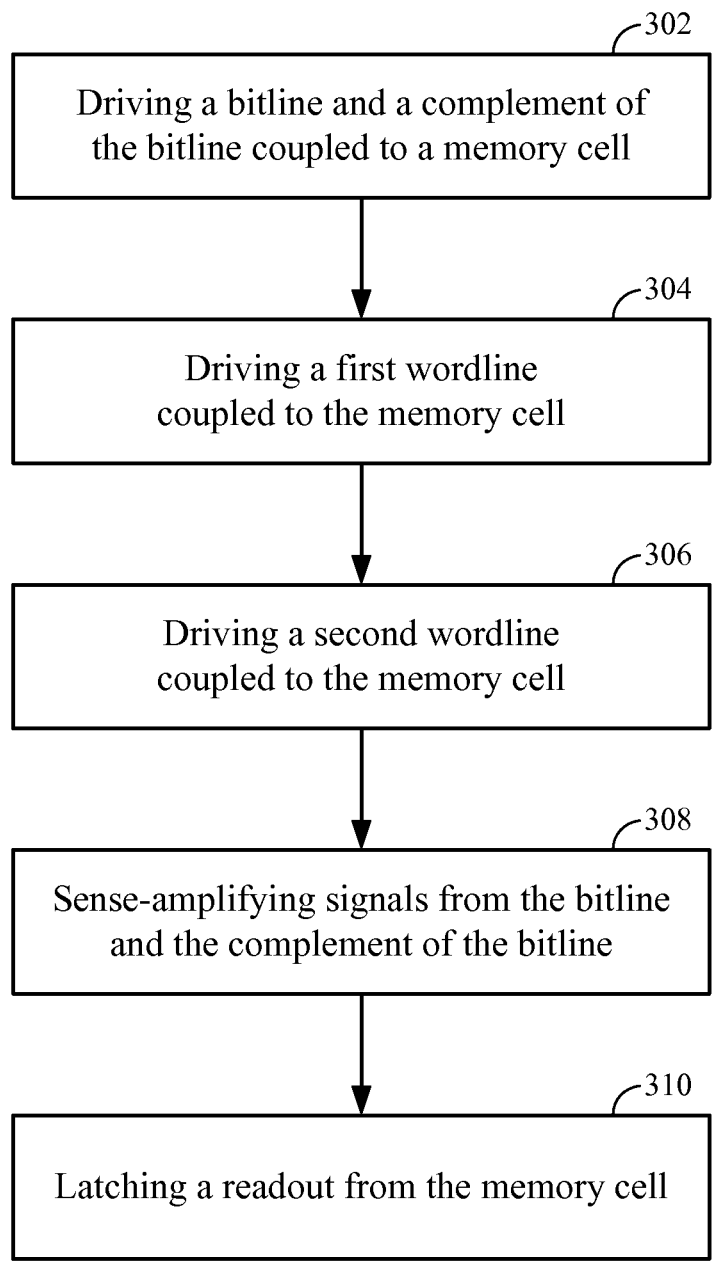
FIG. 3 is a flowchart illustrating a method of operating a memory cell according to an embodiment.

FIG. 3 is a flowchart illustrating an embodiment of a method of operating a memory cell. In an embodiment, a method of operating a memory cell includes the steps of driving a bitline and a complement of the bitline coupled to a memory cell as shown in block 302, driving a first wordline coupled to the memory cell as shown in block 304, driving a second wordline coupled to the memory cell as shown in block 306, sense-amplifying signals from the bitline and the complement of the bitline as shown in block 308, and latching a readout from the memory cell as shown in block 310. In an embodiment, the first wordline comprises a read wordline while the second wordline comprises either a read wordline or a read/write wordline. The method of operating a memory cell as illustrated in the embodiment shown in FIG. 3 may be applied to the memory circuit as shown in FIGS. 1 and 2, although the method may also be applicable to other circuit layouts within the scope of the disclosure.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A memory circuit, comprising:
 a first wordline driver comprising a read wordline driver;
 a second wordline driver comprising a driver selected from the group consisting of a read wordline driver and a read/write wordline driver;
 a first bitline and a second bitline;
 a memory cell coupled to the first and second wordline drivers, and coupled to the first and second bitlines to provide a first voltage on the first bitline complementary to a second voltage of the second bitline;
 a sense amplifier coupled to the memory cell to amplify low-swing voltages on the first and second bitlines to generate a full-swing logic output; and
 a latch coupled to the memory cell to latch a full-swing readout on the first bitline to generate a full-swing logic output.

2. The memory circuit of claim 1, further comprising a data input driver coupled to the memory cell.

3. The memory circuit of claim 2, wherein the data input driver comprises a write data input driver.

4. The memory circuit of claim 2, wherein the data input driver comprises:
 a data input;
 an inverter coupled to the data input; and
 two metal oxide semiconductor (MOS) transistors coupled to the data input.

5. The memory circuit of claim 4, wherein the two MOS transistors comprise N-channel MOS transistors comprising gates coupled to each other and drains coupled to the data input.

6. The memory circuit of claim 1, wherein the first wordline driver comprises an inverter.

7. The memory circuit of claim 1, wherein the second wordline driver comprises an inverter.

8. The memory circuit of claim 1, wherein the memory cell comprises at least eight transistors.

9. The memory circuit of claim 1, wherein the memory cell comprises:
 a flip-flop comprising a first terminal and a second terminal;
 a first metal oxide semiconductor (MOS) transistor coupled to the first terminal of the flip-flop; and
 a second MOS transistor coupled to the second terminal of the flip-flop.

10. The memory circuit of claim 9, wherein the first and second MOS transistors each comprise a gate coupled to the first wordline driver.

11. The memory circuit of claim 9, wherein the first MOS transistor comprises a first N-channel MOS transistor comprising a source coupled to the first terminal of the flip-flop, and wherein the second MOS transistor comprises a second N-channel MOS transistor comprising a drain coupled to the second terminal of the flip-flop.

12. The memory circuit of claim 11, wherein the first N-channel MOS transistor further comprises a drain, wherein the second N-channel MOS transistor further comprises a source, and wherein the sense amplifier is coupled to the drain of the first N-channel MOS transistor and to the source of the second N-channel MOS transistor.

13. The memory circuit of claim 9, wherein the memory cell further comprises:
 a third MOS transistor comprising a gate coupled to the second wordline driver; and a fourth MOS transistor comprising a gate coupled to the second terminal of the flip-flop.

14. The memory circuit of claim 13, wherein the third MOS transistor comprises a third N-channel MOS transistor comprising a drain, and wherein the latch is coupled to the drain of the third N-channel MOS transistor.

15. The memory circuit of claim 9, wherein the flip-flop comprises a first inverter and a second inverter cross-coupled to each other.

16. The memory circuit of claim 15, wherein the first inverter comprises a first P-channel MOS transistor and a first N-channel MOS transistor, and wherein the second inverter comprises a second P-channel MOS transistor and a second N-channel MOS transistor.

17. A memory device, comprising:
a first bitline;
a second bitline;
means for driving the first bitline and the second bitline to provide complementary voltages on the first and second bitlines;
means for driving a first wordline;
means for driving a second wordline;
a memory cell coupled to the means for driving the first and second bitlines, the means for driving the first wordline, and means for driving the second wordline;
means for sense-amplifying signals on the first bitline and the second bitline, to amplify low-swing voltages on the first and second bitlines to generate a full-swing logic output; and
means for latching a readout from the memory cell, to latch a full-swing readout on the first bitline to generate a full-swing logic output.

18. The memory device of claim 17, wherein the means for driving the first wordline comprises a read wordline driver, and wherein the means for driving the second wordline comprises a second wordline driver comprising a driver selected from the group consisting of a read wordline driver and a read/write wordline driver.

19. A method of operating a memory cell, comprising:
driving a first bitline and a second bitline coupled to the memory cell to provide complementary voltages on the first and second bitlines;
driving a first wordline coupled to the memory cell;
driving a second wordline coupled to the memory cell;
sense-amplifying signals from the first bitline and the second bitline to amplify low-swing voltages on the first and second bitlines to generate a full-swing logic output; and
latching a readout from the memory cell to latch a full-swing readout on the first bitline to generate a full-swing logic output.

20. The method of claim 19, wherein the first wordline comprises a read wordline, and wherein the second wordline comprises a wordline selected from the group consisting of a read wordline and a read/write wordline.

\* \* \* \* \*